US 12,417,811 B2

(12) United States Patent
Lee et al.

(10) Patent No.: US 12,417,811 B2
(45) Date of Patent: Sep. 16, 2025

(54) MEMORY DEVICE RELATED TO A VERIFY OPERATION AND METHOD OF OPERATING THE MEMORY DEVICE

(71) Applicant: SK hynix Inc., Icheon-si (KR)

(72) Inventors: Jong Hoon Lee, Icheon-si (KR); Se Chun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 218 days.

(21) Appl. No.: 18/307,603

(22) Filed: Apr. 26, 2023

(65) Prior Publication Data
US 2024/0170078 A1    May 23, 2024

(30) Foreign Application Priority Data
Nov. 21, 2022   (KR) .................. 10-2022-0156347

(51) Int. Cl.
| G11C 11/34 | (2006.01) |
| G06F 3/06 | (2006.01) |
| G11C 16/10 | (2006.01) |
| G11C 16/24 | (2006.01) |
| G11C 16/32 | (2006.01) |
| G11C 16/34 | (2006.01) |
| G11C 16/04 | (2006.01) |

(52) U.S. Cl.
CPC ........ *G11C 16/3459* (2013.01); *G06F 3/0619* (2013.01); *G06F 3/0656* (2013.01); *G06F 3/0659* (2013.01); *G06F 3/0679* (2013.01); *G11C 16/10* (2013.01); *G11C 16/24* (2013.01); *G11C 16/32* (2013.01); *G11C 16/0483* (2013.01)

(58) Field of Classification Search
CPC ............ G11C 16/3455; G11C 16/3459; G11C 16/5628; G11C 16/0483
USPC ..................................... 365/185.22, 189.05
See application file for complete search history.

(56) References Cited

U.S. PATENT DOCUMENTS 10,846,229 B1 * 11/2020 Choi .................... G06F 12/0215
10,896,734 B2 * 1/2021 Yang .................. G11C 16/0483

FOREIGN PATENT DOCUMENTS

| KR | 1020170053032 A | 5/2017 |
| KR | 1020170116068 A | 10/2017 |

* cited by examiner

*Primary Examiner* — Son T Dinh
(74) *Attorney, Agent, or Firm* — WILLIAM PARK AND ASSOCIATES LTD.

(57) ABSTRACT

A memory device includes a plurality of memory cells programmed to a first program state through a plurality of program loops, a page buffer configured to perform a verify operation of verifying the first program state in each of the plurality of program loops, and control logic configured to, as the plurality of program loops are sequentially performed, adjust a first evaluation time of a first evaluation operation so as to decrease the difference between a second evaluation time of a second evaluation operation and the first evaluation time.

14 Claims, 5 Drawing Sheets

MEMORY DEVICE RELATED TO A VERIFY OPERATION AND METHOD OF OPERATING THE MEMORY DEVICE

CROSS-REFERENCE TO RELATED APPLICATION

The present application claims priority under 35 U.S.C. § 119(a) to Korean patent application number 10-2022-0156347 filed on Nov. 21, 2022, in the Korean Intellectual Property Office, the entire disclosure of which is incorporated by reference herein.

BACKGROUND

1. Technical Field

The present disclosure generally relates to a semiconductor device, and more particularly, to a verify operation of a memory device.

2. Related Art

A memory device is a device storing data, and may be classified into a volatile memory device and a nonvolatile memory device.

The memory device may perform a verify operation during a program operation. At this time, when a program state is verified using one verify voltage, a width of a threshold voltage distribution may be widened according to different program speeds of memory cells. Therefore, the memory device may perform a double verify program (DPGM) operation to form a narrower width of the threshold voltage distribution. The double verify program may be an operation of sensing the memory cells twice by differentiating a time based on one verify voltage.

Meanwhile, the memory cells may include slow cells and fast cells. When the same program voltage is applied to the slow cells and the fast cells, a change amount of a threshold voltage of the fast cells may be greater than a change amount of a threshold voltage of the slow cells. In the beginning of the program operation, a ratio of the fast cells is higher than that of the slow cells, but in the latter half of the program operation, the ratio of the slow cells may be higher than that of the fast cells.

SUMMARY

According to an embodiment of the present disclosure, a memory device may include a plurality of memory cells programmed to a first program state through a plurality of program loops, a page buffer configured to perform a verify operation of verifying the first program state in each of the plurality of program loops, and control logic configured to, as the plurality of program loops are sequentially performed, adjust a first evaluation time of a first evaluation operation so as to decrease the difference between a second evaluation time of a second evaluation operation and the first evaluation time.

According to an embodiment of the present disclosure, a method of operating a memory device may include applying a first program voltage to a plurality of memory cells in a first program loop, performing a first verify operation of verifying a first program state of the plurality of memory cells based on a first evaluation time in the first program loop, performing a second verify operation of verifying the first program state based on a second evaluation time in the first program loop, increasing the first evaluation time, applying a second program voltage to the plurality of memory cells in a second program loop, performing the first verify operation of verifying the first program state based on the increased first evaluation time in the second program loop, and performing the second verify operation of verifying the first program state based on the second evaluation time in the second program loop.

According to an embodiment of the present disclosure, a memory device may include a plurality of memory cells programmed to any one program state among a plurality of program states, a page buffer configured to perform a first verify operation and a second verify operation of verifying the program state in a program loop, an evaluation time controller configured to increase a first evaluation time of a first evaluation operation included in the first verify operation and maintain a second evaluation time of a second evaluation operation included in the second verify operation whenever the program loop is changed, and a page buffer controller configured to control the page buffer to perform the first evaluation operation based on the first evaluation time and perform the second evaluation operation based on the second evaluation time.

DETAILED DESCRIPTION

Specific structural or functional descriptions of embodiments according to the concept of the present disclosure disclosed in the present specification or application are illustrated to describe the embodiments according to the concept of the present disclosure. The embodiments according to the concept of the present disclosure may be carried out in various forms and are not limited to the embodiments described in the present specification or application.

An embodiment of the present disclosure provides a memory device and a method of operating the same capable of improving a threshold voltage distribution of memory cells.

Figure 1:
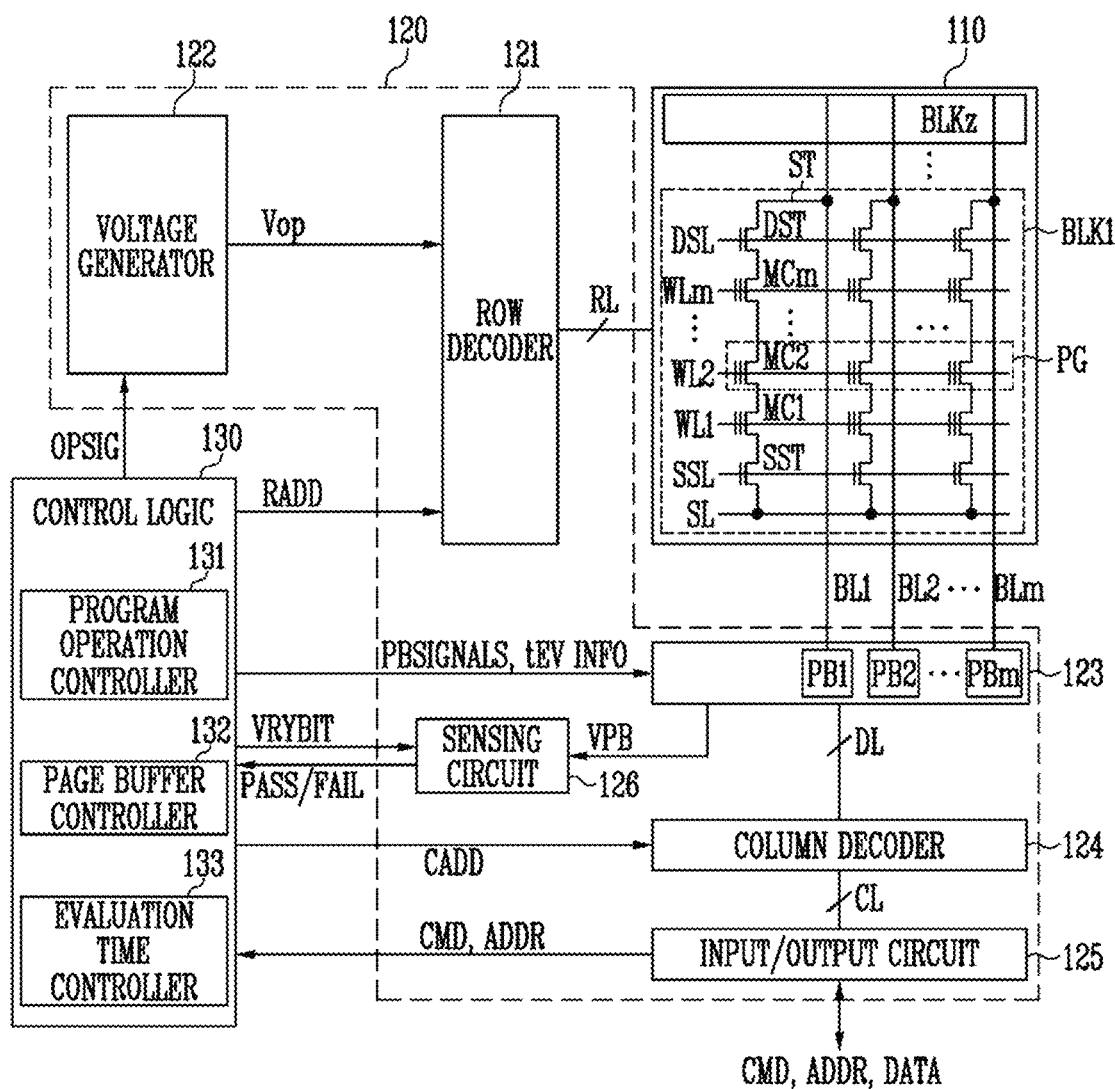
FIG. 1 is a diagram illustrating a memory device according to an embodiment of the present disclosure.

FIG. 1 is a diagram illustrating a memory device according to an embodiment of the present disclosure.

Referring to FIG. 1, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz.

The plurality of memory blocks BLK1 to BLKz are connected to a row decoder 121 through row lines RL. Here, the row lines RL may include at least one source select line SSL, a plurality of word lines WL1 to WLm, and at least one drain select line DSL.

The plurality of memory blocks BLK1 to BLKz may be connected to a page buffer group 123 through bit lines BL1 to BLm. The plurality of memory blocks BLK1 to BLKz may include a plurality of memory cell strings ST connected between the bit lines BL1 to BLm and a source line SL. The memory cell string ST may include at least one source select transistor SST, a plurality of memory cells MC1 to MCm, and at least one drain select transistor DST connected in series between the source line SL and the bit lines BL1 to BLm.

Each of the plurality of memory blocks BLK1 to BLKz includes the plurality of memory cells MC1 to MCm. Memory cells connected to the same word line may be defined as one page PG.

The peripheral circuit 120 may be configured to perform a program operation, a read operation, or an erase operation on a selected area of the memory cell array 110 under control of the control logic 130.

The peripheral circuit 120 may include the row decoder 121, a voltage generator 122, the page buffer group 123, a column decoder 124, an input/output circuit 125, and a sensing circuit 126.

The row decoder 121 may be configured to decode a row address RADD received from the control logic 130. The row decoder 121 selects at least one of the memory blocks BLK1 to BLKz according to a decoded address. In addition, the row decoder 121 may select at least one word line of the memory block selected according to the decoded address. The row decoder 121 may apply operation voltages Vop generated by the voltage generator 122 to the selected word line.

For example, during the program operation, the row decoder 121 may apply a program voltage to the selected word line and apply a program pass voltage of a level lower than that of the program voltage to an unselected word line. During a program verify operation, the row decoder 121 may apply a verify voltage to the selected word line and a verify pass voltage higher than the verify voltage to the unselected word lines.

The voltage generator 122 may be configured to generate a plurality of voltages using an external power voltage supplied to the memory device 100. Specifically, the voltage generator 122 may generate various operation voltages Vop used for the program, read, and erase operations in response to an operation signal OPSIG. The generated operation voltages Vop may be supplied to the memory cell array 110 by the row decoder 121.

The page buffer group 123 includes first to m-th page buffers PB1 to PBm. The first to m-th page buffers PB1 to PBm may store data received through the first to m-th bit lines BL1 to BLm in response to page buffer control signals PBSIGNALS, or may sense a voltage or a current of the bit lines BL1 to BLm during the read operation or a verify operation.

The column decoder 124 may transfer data between the input/output circuit 125 and the page buffer group 123 in response to a column address CADD.

The input/output circuit 125 may transfer a command CMD and an address ADDR received from a memory controller (not shown) to the control logic 130, or may exchange the data DATA with the column decoder 124.

The sensing circuit 126 may generate a reference current in response to an allowable bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the allowable bit signal VRYBIT in response to the command CMD and the address ADDR to control the peripheral circuits 120. In addition, the control logic 130 may determine whether the verify operation is passed or failed in response to the pass signal PASS or the fail signal FAIL.

In an embodiment, the control logic 130 may include a program operation controller 131, a page buffer controller 132, and an evaluation time controller 133. In an embodiment, the program operation controller 131, the page buffer controller 132, and the evaluation time controller 133 may be implemented as hardware, software, or a combination of hardware and software. For example, the program operation controller 131, the page buffer controller 132, and the evaluation time controller 133 may be a circuit or a processor operating according to an algorithm, or a processor executing a code.

The program operation controller 131 may control the program operation of the memory device 100. The program operation is described with reference to FIG. 2 to be described later. For example, the program operation controller 131 may provide the operation signal OPSIG for controlling to generate the program voltage and the verify voltage to the voltage generator 122, and generate the row address RADD by decoding the address ADDR of a word line in which data DATA is to be stored.

The page buffer controller 132 may provide the page buffer control signals PBSIGNALS for controlling to perform the verify operation to the page buffer group 123.

The evaluation time controller 133 may control an evaluation time of an evaluation operation included in the verify operation. For example, the evaluation time controller 133 may adjust the evaluation time and provide evaluation time information tEV INFO indicating the adjusted evaluation time to the page buffer group 123.

In an embodiment, the evaluation time controller 133 may change the evaluation time for each program loop when verifying a specific program state of memory cells through a plurality of program loops. At this time, as the program loop is progressed, a difference between an evaluation time of a first evaluation operation included in the verify operation and an evaluation time of a second evaluation operation may be decreased.

Figure 2:
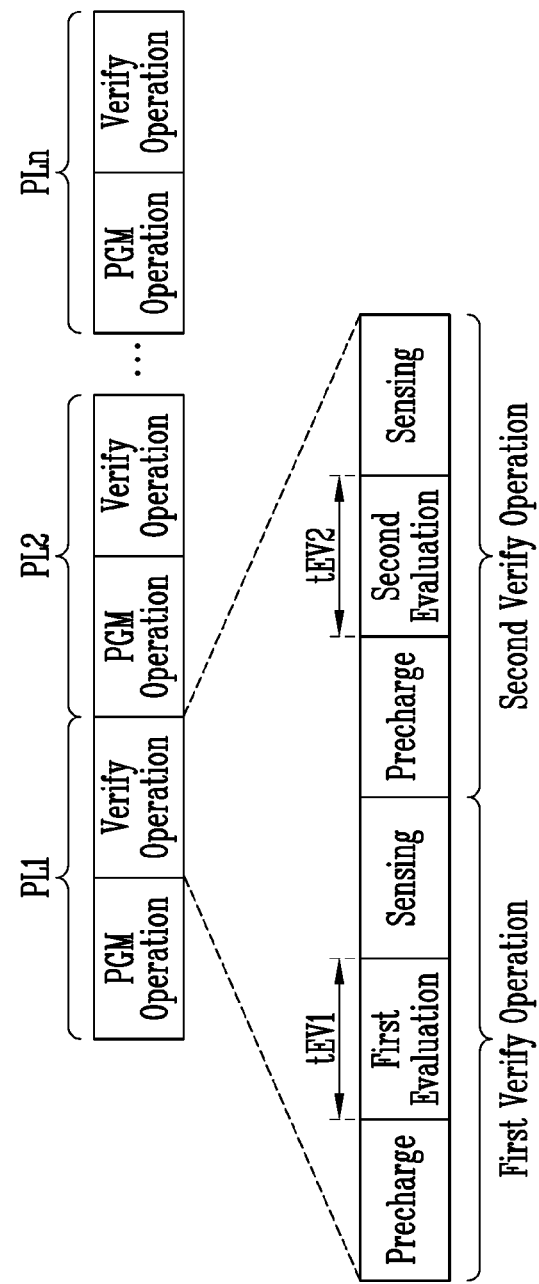
FIG. 2 is a diagram illustrating a program operation according to an embodiment of the present disclosure.

FIG. 2 is a diagram illustrating a program operation according to an embodiment of the present disclosure.

Referring to FIG. 2, the program operation may include a plurality of program loops PL1 to PLn. Selected memory cells may be programmed to have a threshold voltage corresponding to any one of a plurality of program states through the plurality of program loops PL1 to PLn.

Each of the plurality of program loops PL1 to PLn may include a program voltage apply operation PGM Operation of providing the program voltage and a verify operation Verify Operation of verifying whether the memory cells are programmed by applying the verify voltages.

For example, when a first program loop PL1 is performed, after a first program voltage is applied in the program voltage apply operation PGM Operation, the verify voltages may be sequentially applied to verify the program state of the plurality of memory cells in the verify operation Verify Operation.

Memory cells of which verification is passed by each of the verify voltages are determined to have a target program state, and are then program inhibited in a second program loop PL2. A second program voltage higher than the first program voltage by a unit voltage may be applied to program remaining memory cells except for the program inhibited memory cells in the second program loop PL2. Thereafter, a verify operation may be performed identically to the verify operation of the first program loop PL1. For example, a verify pass may indicate that the memory cell is read as an off-cell by a corresponding verify voltage.

During the program voltage apply operation PGM Operation, the page buffer may transfer data received through the input/output circuit to the selected memory cells through the bit lines when the program voltage is applied to the selected word line. Memory cells of a page selected according to the transferred data may be programmed. A memory cell connected to a bit line to which a program allowable voltage (for example, a ground voltage GND) is applied may have an increased threshold voltage. A threshold voltage of a memory cell connected to a bit line to which a program inhibit voltage (for example, a power voltage) is applied may be maintained.

During the verify operation Verify Operation, the verify voltage may be applied to the selected word line, which is a word line to which the selected memory cells are connected, and the page buffer may sense the current or the voltage flowing through the bit lines respectively connected to the selected memory cells.

For example, the memory device 100 may store a state of the memory cell according to the voltage of the bit line. Here, the state of the memory cell may be a state corresponding to any one of a verify pass or a verify fail. When a threshold voltage of the memory cell is higher than the verify voltage applied to the selected word line, the memory cell may be read as an off-cell, and the memory cell read as the off-cell may correspond to a verify pass state. Conversely, when the threshold voltage of the memory cell is lower than the verify voltage applied to the selected word line, the memory cell may be read as an on-cell, and the memory cell read as the on-cell may correspond to a verify fail state.

In an embodiment, the verify operation Verify Operation may include a first verify operation First Verify Operation and a second verify operation Second Verify Operation according to a double verify program. At this time, each of the first verify operation First Verify Operation and the second verify operation Second Verify Operation may include a precharge operation Precharge, an evaluation operation, and a sensing operation Sensing.

The precharge operation Precharge may be an operation of precharging the bit lines.

The evaluation operation may be an operation of evaluating the threshold voltage of the memory cells according to a voltage or a current of selected bit lines. An evaluation time of the evaluation operation may be set to a time in which the threshold voltage of the memory cell may be reflected in the bit lines. In an embodiment, a first evaluation time tEV1 of a first evaluation operation First Evaluation may be shorter than a second evaluation time tEV2 of a second evaluation operation Second Evaluation.

The sensing operation Sensing may be an operation of sensing data based on the voltage or the current of the bit lines and storing the data in a latch of the page buffer.

Figure 3:
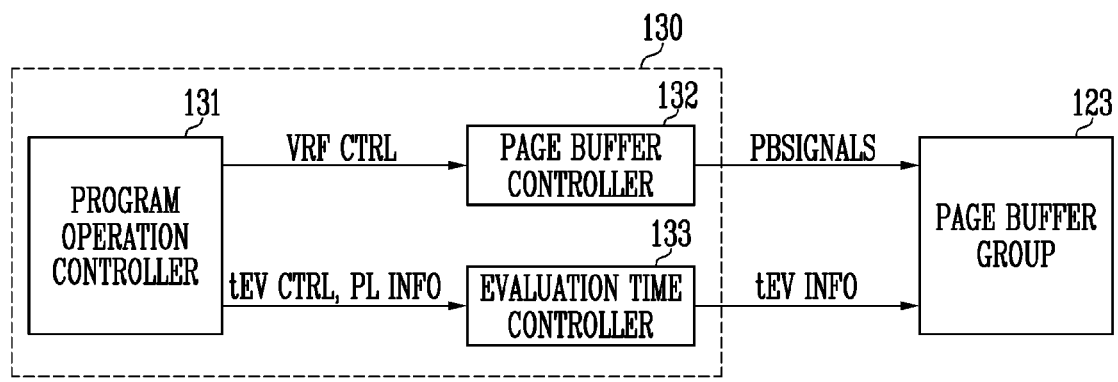
FIG. 3 is a diagram illustrating an example of controlling a verify operation according to an embodiment of the present disclosure.

FIG. 3 is a diagram illustrating an example of controlling a verify operation according to an embodiment of the present disclosure.

Referring to FIG. 3, the program operation controller 131 may provide the page buffer controller 132 with a verify operation control signal VRF CTRL for controlling to perform the verify operation in every program loop.

In an embodiment, the page buffer controller 132 may provide the page buffer control signals PBSIGNALS for controlling the verify operation of the page buffers to the page buffer group 123 in response to the verify operation control signal VRF CTRL. The page buffer control signals PBSIGNALS may include a bit line precharge signal, a page sensing signal, a sensing node discharge signal, and the like.

In addition, the program operation controller 131 may provide the evaluation time controller 133 with an evaluation time control signal tEV CTRL and program loop information PL INFO for controlling the evaluation time of the evaluation operation for each program loop. In an embodiment, the program loop information PL INFO may include information on an order of a currently performed program loop, a program state verified in a corresponding program loop, and the like.

In an embodiment, the evaluation time controller 133 may adjust the first evaluation time based on the program loop information PL INFO in response to the evaluation time control signal tEV CTRL. The evaluation time controller 133 may provide the evaluation time information tEV INFO indicating the adjusted first evaluation time (i.e., tEV1) to the page buffer group 123.

For example, the evaluation time controller 133 may increase the first evaluation time of the first evaluation operation as a program loop for a verify operation for a specific program state is progressed. At this time, the first evaluation time may be increased by a unit time. In an embodiment, the unit time may be a preset duration of time. Specifically, the evaluation time controller 133 may increase the first evaluation time based on the program loop information PL INFO when a verify operation for a specific program state performed in a current program loop is also performed in a previous program loop. In contrast, the evaluation time controller 133 may determine the first evaluation time as a preset initial value when the verify operation for the specific program state performed in the current program loop is not performed in the previous program loop. That is, the first evaluation time may be set as the initial value in a program loop in which the verify operation of the specific program state is first started, and may increase whenever the program loop is changed. The initial value may be the smallest value among the first evaluation times. The word "preset" as used herein with respect to a parameter, such as a preset initial value, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

As another example, the evaluation time controller 133 may store an evaluation time table including the first evaluation times for each program loop. At this time, the evaluation time table may include a value in which the first evaluation time is increased as an order of the plurality of program loops in which the verify operation for the specific program state is performed is higher. In this case, the evaluation time controller 133 may determine the first evaluation time based on the program loop information PL INFO and the evaluation time table.

Meanwhile, the above-described example of adjusting the first evaluation time is only an example, and a method of adjusting the first evaluation time may vary according to an embodiment.

In an embodiment, the evaluation time controller 133 may maintain the second evaluation time in the plurality of program loops. In this case, as the plurality of program loops are sequentially performed, a difference between the first evaluation time and the second evaluation time may be decreased.

Figure 4:
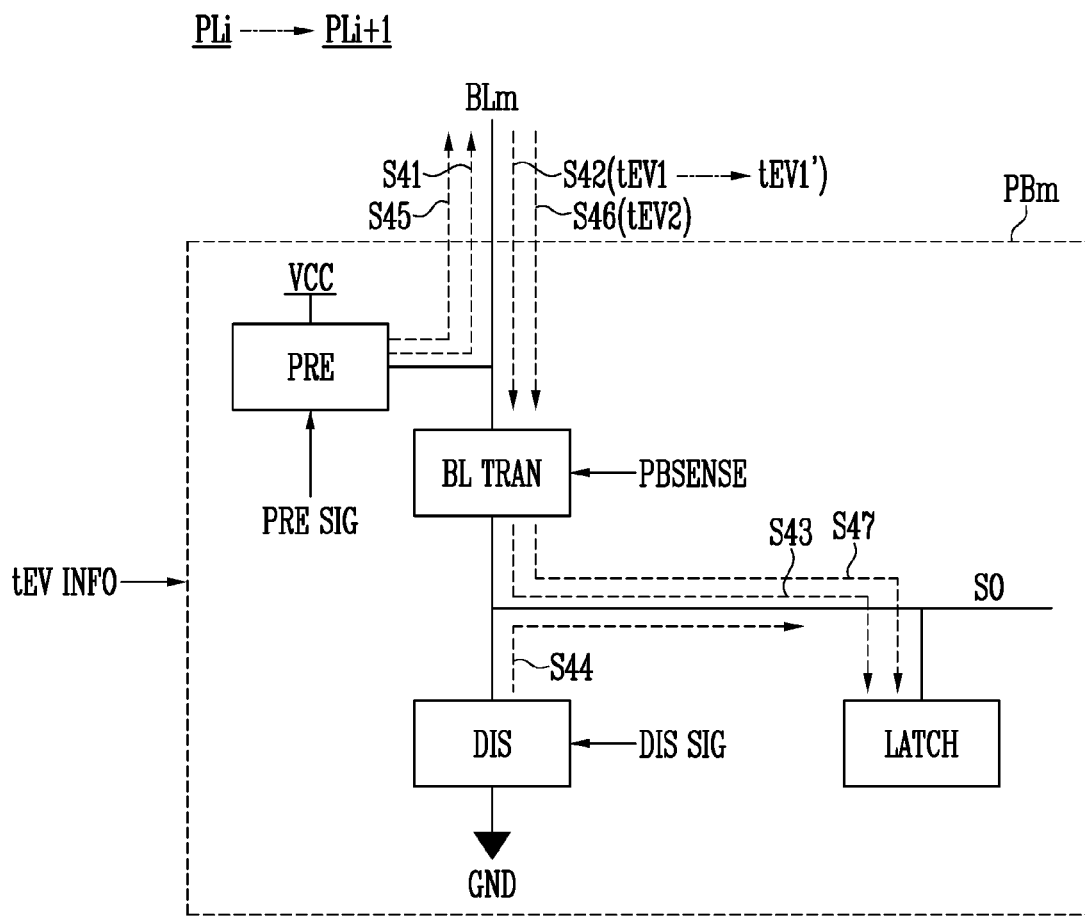
FIG. 4 is a diagram illustrates an operation of a page buffer performing a double verify operation according to an embodiment of the present disclosure.

FIG. 4 is a diagram illustrates an operation of a page buffer performing a double verify operation according to an embodiment of the present disclosure.

In FIG. 4, an operation of the m-th page buffer PBm included in the page buffer group 123 of FIG. 1 is exemplified for convenience of description, but other page buffers may be equally applied. In addition, FIG. 4 may illustrate a double verify operation in a PLi-th program loop PLi and a (PLi+1)-th program loop PLi+1. The (PLi+1)-th program loop PLi+1 may be a program loop performed after the PLi-th program loop PLi, and the PLi-th program loop PLi and the (PLi+1)-th program loop PLi+1 may perform a verify operation for the same program state.

The m-th page buffer PBm may include a precharge circuit PRE, a bit line transmission circuit BL TRAN, a discharge circuit DIS, and a latch LATCH. The m-th page buffer PBm includes various circuits in addition to the circuits shown in FIG. 4, but only some circuits necessary for an embodiment of the present disclosure are shown in FIG. 4.

Steps S41 to S43 of FIG. 4 may indicate the first verify operation including the first evaluation operation, and steps S45 to S47 may indicate the second verify operation including the second evaluation operation.

First, the operation of the m-th page buffer PBm in the PLi-th program loop PLi is described.

In step S41, the precharge circuit PRE may transfer power voltage VCC to the m-th bit line BLm in response to a bit line precharge signal PRE SIG to precharge the m-th bit line BLm to a positive voltage.

In step S42, the verify voltage may be applied to the selected word line and the first evaluation operation may be performed. At this time, in the case of a bit line connected to memory cells having a threshold voltage higher than the verify voltage among the selected memory cells, a precharge voltage may be maintained. In contrast, in a case of a bit line connected to memory cells having a threshold voltage lower than the verify voltage among the selected memory cells, a voltage may be decreased. In an embodiment, the m-th page buffer PBm may set the first evaluation time tEV1 based on the evaluation time information TEV INFO. The m-th page buffer PBm may perform the first evaluation operation during the first evaluation time tEV1.

In step S43, the bit line transmission circuit BL TRAN may connect the m-th bit line BLm and a sensing node SO in response to a page sensing signal PBSENSE. For example, the bit line transmission circuit BL TRAN may be activated, and thus a voltage or a current of the m-th bit line BLm may be transmitted to the latch LATCH through the sensing node SO. The sensed voltage stored in the latch LATCH may be transferred to the sensing circuit 126 of FIG. 1 and used to determine pass or fail of the verify operation.

In step S44, the discharge circuit DIS may discharge the sensing node SO in response to a discharge signal DIS SIG, and may initialize the sensing node SO.

Step S45 may be a precharge operation of the second verify operation and may be performed identically to step S41.

In step S46, the m-th page buffer PBm may set the second evaluation time tEV2 based on the evaluation time information tEV INFO. The verify voltage may be applied to the selected word line, and the m-th page buffer PBm may perform the second evaluation operation during the second evaluation time tEV2.

Step S47 may be a sensing operation of the second verify operation and may be performed identically to step S43.

Next, the operation of the m-th page buffer PBm in the (PLi+1)-th program loop PLi+1 is described. At this time, steps S41 and S43 to S47 may be performed identically to the operation in the PLi-th program loop PLi, and thus a repetitive description is omitted.

In step S42 of the (PLi+1)-th program loop PLi+1, the m-th page buffer PBm may set an increased first evaluation time tEV1' based on the evaluation time information tEV INFO. The m-th page buffer PBm may perform the first evaluation operation during the increased first evaluation time tEV1'. That is, a difference between the increased first evaluation time tEV1' and the second evaluation time tEV2 may be less than the difference between the first evaluation time tEV1 and the second evaluation time tEV2.

Figure 5:
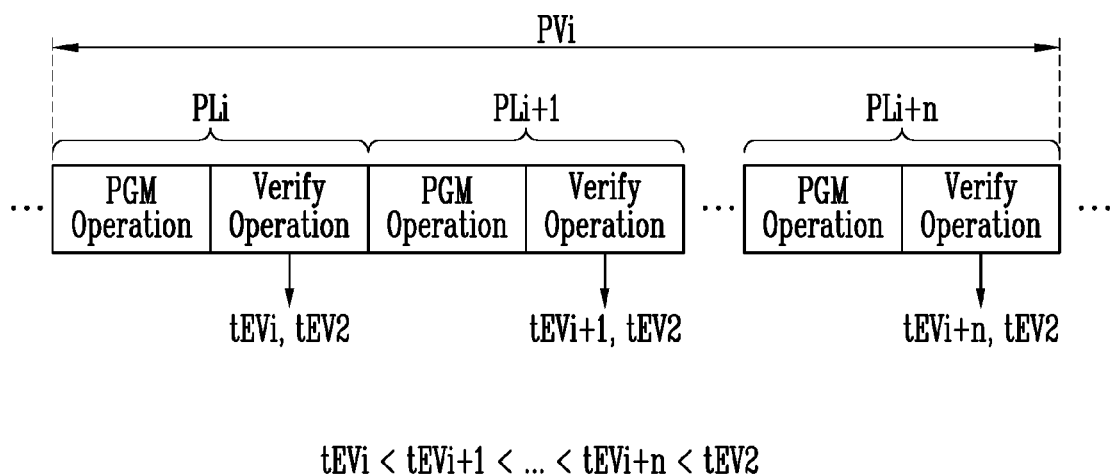
FIG. 5 is a diagram illustrating an example of an evaluation time according to a program loop according to an embodiment of the present disclosure.

FIG. 5 is a diagram illustrating an example of an evaluation time according to a program loop according to an embodiment of the present disclosure.

In FIG. 5, an example of an evaluation time during a verify operation PVi for an i-th program state among a plurality of program states is described. However, other program states other than the i-th program state may be equally applied.

In an embodiment, the verify operation PVi for the i-th program state may be performed from an i-th program loop PLi to an (i+n)-th program loop PLi+n. At this time, a first evaluation time of each of the i-th program loop PLi to the (i+n)-th program loop PLi+n may be different. For example, among first evaluation times tEVi to tEVi+n, the first evaluation time tEVi of the first evaluation operation included in the i-th program loop PLi may be the shortest, and the first evaluation time tEVi+n of the first evaluation operation included in the (i+n)-th program loop PLi+n may be the longest. That is, the first evaluation time may increase from the i-th program loop PLi to the (i+n)-th program loop PLi+n.

In addition, the second evaluation time tEV2 may be the same in the i-th program loop PLi to the (i+n)-th program loop PLi+n. The second evaluation time tEV2 may be longer than the first evaluation times tEVi to tEVi+n.

Therefore, a difference between the first evaluation time and the second evaluation time may be decreased according to progress of the program loop for each program state.

Figure 6:
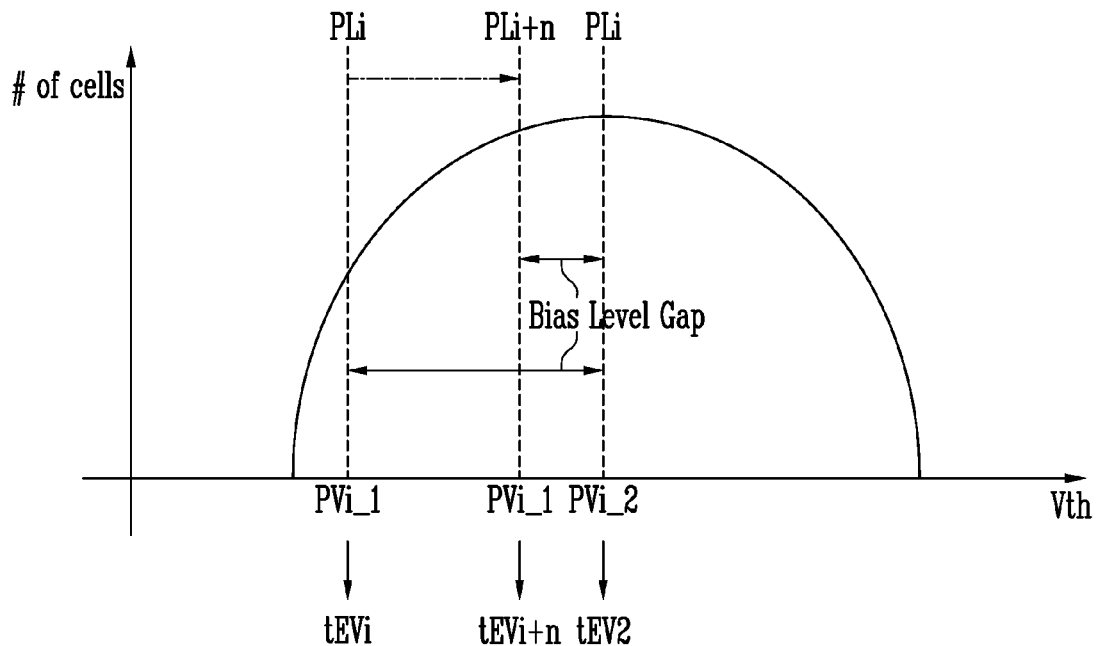
FIG. 6 is a diagram illustrating a difference of a threshold voltage according to a first evaluation time and a second evaluation time according to an embodiment of the present disclosure.

FIG. 6 is a diagram illustrating a difference of a threshold voltage according to a first evaluation time and a second evaluation time according to an embodiment of the present disclosure.

Referring to FIG. 6, a horizontal axis may indicate the threshold voltage of the memory cell, and a vertical axis may indicate the number of memory cells.

A voltage level bias difference Bias Level Gap between a first verify operation PVi_1 and a second verify operation PVi_2 for the i-th program state may correspond to a difference between the first evaluation times tEVi to tEVi+n of the first verify operation PVi_1 and the second evaluation time tEV2 of the second verify operation PVi_2.

The voltage level bias difference Bias Level Gap between the first verify operation PVi_1 for the i-th program state and the second verify operation PVi_2 for the i-th program state may be decreased while the i-th program loop PLi to the (i+n)-th program loop PLi+n are progressed. At the beginning of the program loop, the ratio of the fast cell is higher, but the voltage level bias difference Bias Level Gap is relatively large, and thus, in an embodiment, a threshold voltage distribution may be improved. In addition, in an embodiment, in the latter half of the program loop, the ratio of the slow cell is high, but the voltage level bias difference Bias Level Gap is relatively small, and thus the threshold voltage distribution may be improved.

Figure 7:
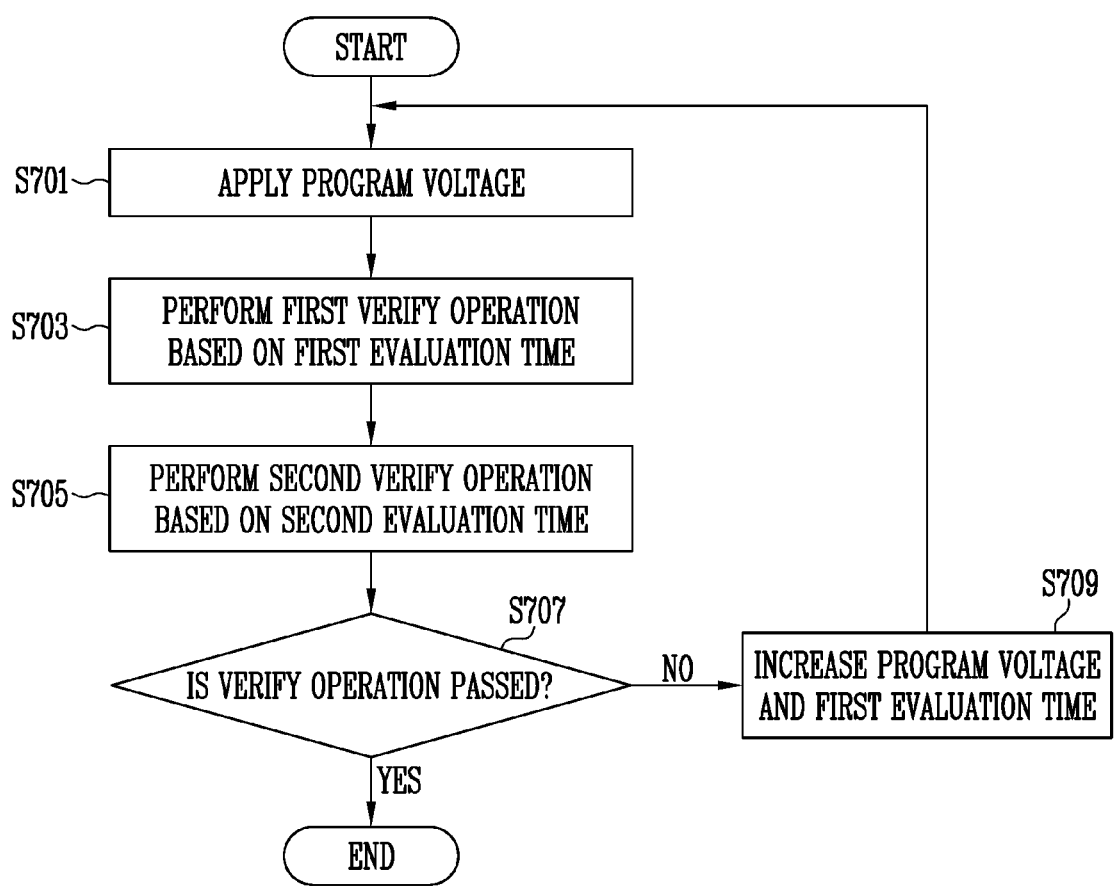
FIG. 7 is a diagram illustrating a method of operating a memory device according to an embodiment of the present disclosure.

FIG. 7 is a diagram illustrating a method of operating a memory device according to an embodiment of the present disclosure.

The method shown in FIG. 7 may be performed by, for example, the memory device 100 shown in FIG. 1.

In step S701, the memory device 100 may apply the program voltage to the plurality of memory cells in the current program loop.

In step S703, the memory device 100 may perform the first verify operation of verifying the first program state of the plurality of memory cells based on the first evaluation time in the current program loop.

In step S705, the memory device 100 may perform the second verify operation of verifying the first program state based on the second evaluation time in the current program loop.

In step S707, the memory device 100 may determine whether the verify operation of the first program state is passed based on the first verify operation and the second verify operation in the current program loop. When the verify operation is passed according to a determination result of step S707, step may be ended. Alternatively, when the verify operation is not passed according to the determination result of step S707, step S709 may be performed.

In step S709, the memory device 100 may increase the program voltage and the first evaluation time.

Thereafter, the memory device 100 may perform steps S701 to S707 based on the increased program voltage and the increased first evaluation time in a next program loop.

What is claimed is:

1. A memory device comprising:
    a plurality of memory cells programmed to a first program state through a plurality of program loops;
    a page buffer configured to apply a program voltage to the plurality of memory cells, to perform a first verify operation of verifying the first program state based on a first evaluation time, and to perform a second verify operation of verifying the first program state based on a second evaluation time, in each of the plurality of program loops; and
    control logic configured to, as the plurality of program loops are sequentially performed, adjust the first evaluation time so as to decrease the difference between the second evaluation time and the first evaluation time.

2. The memory device of claim 1, wherein the first evaluation time is shorter than the second evaluation time.

3. The memory device of claim 2, wherein the control logic increases the first evaluation time as the plurality of program loops are sequentially performed.

4. The memory device of claim 3, wherein the control logic maintains the second evaluation time in the plurality of program loops.

5. The memory device of claim 1, wherein the first program state is any one of a plurality of program states classified based on a threshold voltage.

6. The memory device of claim 1, wherein the page buffer performs the first evaluation operation based on a first evaluation time and performs a second evaluation operation based on the second evaluation time, when a verify voltage is applied to a word line connected to the plurality of memory cells.

7. A method of operating a memory device, the method comprising:
    applying a first program voltage to a plurality of memory cells in a first program loop;
    performing a first verify operation of verifying a first program state of the plurality of memory cells based on a first evaluation time in the first program loop;
    performing a second verify operation of verifying the first program state based on a second evaluation time in the first program loop;
    increasing the first evaluation time;
    applying a second program voltage to the plurality of memory cells in a second program loop;
    performing the first verify operation of verifying the first program state based on the increased first evaluation time in the second program loop; and
    performing the second verify operation of verifying the first program state based on the second evaluation time in the second program loop.

8. The method of claim 7, wherein performing the first verify operation in the first program loop comprises:
    precharging bit lines connected to the plurality of memory cells;
    performing a first evaluation operation of evaluating a threshold voltage of the plurality of memory cells according to the first evaluation time; and
    storing data sensed according to a voltage of the bit lines in a latch.

9. The method of claim 8, wherein performing the first verify operation in the second program loop comprises:
    precharging the bit lines;
    performing the first evaluation operation according to the increased first evaluation time; and
    storing the data sensed according to the voltage of the bit lines in the latch.

10. The method of claim 7, wherein performing the second verify operation in the first program loop or the second program loop comprises:
    precharging bit lines connected to the plurality of memory cells;
    performing a second evaluation operation of evaluating a threshold voltage of the plurality of memory cells according to the second evaluation time; and
    storing data sensed according to a voltage of the bit lines in a latch.

11. The method of claim 7, wherein the increased first evaluation time is shorter than the second evaluation time.

12. A memory device comprising:
    a plurality of memory cells programmed to any one program state among a plurality of program states;
    a page buffer configured to perform a first verify operation and a second verify operation of verifying the program state in a program loop;
    an evaluation time controller configured to increase a first evaluation time of a first evaluation operation included in the first verify operation and maintain a second evaluation time of a second evaluation operation included in the second verify operation whenever the program loop is changed; and a page buffer controller configured to control the page buffer to perform the first evaluation operation based on the first evaluation time and perform the second evaluation operation based on the second evaluation time.

13. The memory device of claim 12, wherein the evaluation time controller increases the first evaluation time by a unit time.

14. The memory device of claim 12, wherein the evaluation time controller sets the first evaluation time to an initial value in a program loop in which the first verify operation and the second verify operation are first started.

* * * * *